United States Patent
Ross et al.

(10) Patent No.: US 8,643,417 B1
(45) Date of Patent: Feb. 4, 2014

(54) METHOD AND APPARATUS TO AUTOMATICALLY SCALE DLL CODE FOR USE WITH SLAVE DLL OPERATING AT A DIFFERENT FREQUENCY THAN A MASTER DLL

(75) Inventors: Diarmuid P. Ross, Mountain View, CA (US); Douglas C. Lee, Cupertino, CA (US); David S. Warren, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/546,540

(22) Filed: Jul. 11, 2012

(51) Int. Cl.
*H03L 7/00* (2006.01)

(52) U.S. Cl.
USPC .......................................................... 327/161

(58) Field of Classification Search
USPC .......................................................... 327/161
See application file for complete search history.

(56) References Cited

U.S. PATENT DOCUMENTS

| | | | |
|---|---|---|---|
| 7,697,592 B2 | 4/2010 | Ogasawara | |
| 8,132,040 B1 | 3/2012 | Bartel | |
| 2011/0115569 A1 | 5/2011 | Yamakido et al. | |

*Primary Examiner* — Daniel Rojas
(74) *Attorney, Agent, or Firm* — Lawrence J. Merkel; Erik A. Heter; Meyertons, Hood, Kivlin, Kowert & Goetzel, P.C.

(57) ABSTRACT

A method and apparatus for scaling a DLL code for a slave DLL operating at a different frequency than a master DLL is disclosed. An apparatus includes a master DLL coupled to receive a first clock signal and a group of series-coupled slave DLLs coupled to receive a second clock signal. The master DLL may provide a specified fraction of a cycle of the first clock signal. Scaling circuitry coupled between the master DLL and the group of slave DLLs may determine a ratio of frequencies of the first clock signal to the second clock signal. Based on the ratio and a delay code from the first DLL, the scaling circuitry may generate an adjusted delay code received by the group of slave DLLs to set a delay for the second clock signal to the specified fraction.

15 Claims, 5 Drawing Sheets

METHOD AND APPARATUS TO AUTOMATICALLY SCALE DLL CODE FOR USE WITH SLAVE DLL OPERATING AT A DIFFERENT FREQUENCY THAN A MASTER DLL

BACKGROUND

1. Technical Field

This invention relates to electronic circuits, and more particularly, to clocking circuits.

2. Description of the Related Art

Memory interfaces in electronic systems may be arranged to interface with more than one type of memory. For example, a memory interface may be coupled to a storage-type memory, such as flash, and one of various types of random access memory (RAM). In some cases, these memories may be source synchronous. In a source synchronous system, a clock may be sourced with the data provided. Thus, in memory systems that implement source synchronous memories, a clock may be provided when data is returned from the memory during a read.

Since multiple source synchronous memories may be coupled to a memory interface, multiple clock domains may be created. In some cases, these clock signals may be delayed by at least a portion of a cycle for conducting reads to ensure enough set-up and hold time for the incoming data. For multiple clock domains (e.g., from multiple source synchronous clocks from multiple memories), multiple delay locked loops (DLLs) may be implemented to provide the delays. To ensure consistency of the delay time across the clock domains, a DLL for one of the clock domains may be designated as a master DLL, while DLLs for the other clock domains may be designated as slave DLLs. The master DLL may be configured to provide the desired delay to the respective clock signal in its domain. A delay code indicating this delay may be provided to the slave DLLs, which may set their respective delay accordingly.

SUMMARY

A method and apparatus for scaling a DLL code for a slave DLL operating at a different frequency than a master DLL is disclosed. In one embodiment, an apparatus includes a master DLL coupled to receive a first clock signal and a group of series-coupled slave DLLs coupled to receive a second clock signal. The frequency of the second clock signal is less than that of the first clock signal. The master DLL may provide a specified fraction of a cycle of the first clock signal (e.g., ¼ clock cycle). Scaling circuitry coupled between the master DLL and the group of slave DLLs may receive the first and second clock signals and determine a ratio of their respective frequencies. Based on the ratio and a delay code from the first DLL, the scaling circuitry may generate an adjusted delay code received by the group of slave DLLs to set a delay for the second clock signal to the specified fraction.

In one embodiment, a method includes providing first and second clock signals to scaling circuitry coupled between a master DLL and a group of slave DLLs coupled in series. The master DLL is coupled to receive the first clock signal, while the group of slave DLLs is coupled to receive the second clock signal, wherein the frequency of the second clock signal is less than that of the first. The method further includes the scaling circuitry determining a ratio of the first clock signal to the frequency of the second clock signal. Using this ratio, and a delay code provided from the master DLL, an adjusted delay code is generated to be provided to the group of slave DLLs.

BRIEF DESCRIPTION OF THE DRAWINGS

The following detailed description makes reference to the accompanying drawings, which are now briefly described.

Figure 1:
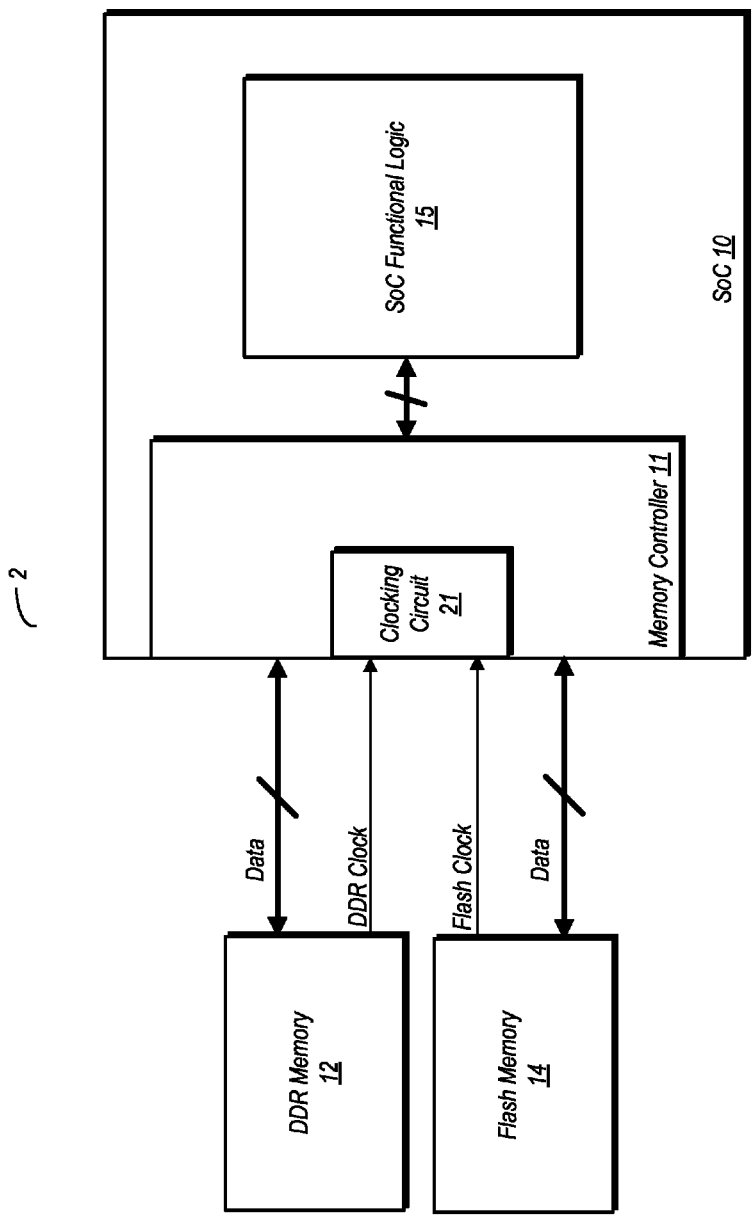
FIG. 1 is a block diagram of one embodiment of a system having a memory interface coupled to multiple types of memories.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of a system including a memory interface coupled to multiple types of memories. In the embodiment shown, system 2 includes a system on a chip (SoC) 10, a double data rate (DDR) memory 12, and a flash memory 14. Other components may also be included, but are not shown here for the sake of simplicity. SoC 10 in the embodiment shown includes a memory interface in the form of memory controller 11. Internally to SoC 10, memory controller 11 is coupled to SoC functional logic 15, which may include various types of logic such as processor cores, graphics processing units, input/output (I/O) interfaces, and so forth.

Memory controller 11 in the embodiment shown is coupled to DDR memory 12 and flash memory 14. DDR memory 12 may serve as a random access memory (RAM) during operation of system 2, while flash memory 14 may provide bulk storage. Both of these memories may provide a respective clock signal along with data to memory controller 11 during read cycles. More particular, DDR memory 12 is configured to provide the DDR clock signal, while the flash memory is configured to provide the flash clock signal.

Clocking circuitry 21 in memory controller 11 may provide some delay to received clock signals to allow a sufficient amount of setup and hold time to correctly read the data. In one embodiment, clocking circuit 21 may delay a received clock signal by ¼ of its respective cycle. In general, clocking circuit 21 may be configured to delay clock cycles by a fixed fractional amount of a cycle, irrespective of the frequency of that clock signal. As defined herein, "fractional delay" and related terms may refer to an amount of delay provided to a clock signal as a fraction of one of its cycles. For example, a clock signal may have a fractional delay of ¼ of a clock cycle. Moreover, two clock signals having different frequencies/periods may be delayed by a different amount of time, but may nevertheless be delayed by the same amount of fractional delay. Thus, using the example above, two clock signals having different frequencies may be each be delayed by ¼ cycle of fractional delay, even though the amount of time each is delayed (e.g., in terms of nanoseconds) is different. The fractional delay of a clock signal may also be expressed in terms of the percentage of a cycle for which it is delayed (e.g., ¼ cycle or 25% of a cycle).

Each of the clock signals may be received by a delay locked loop (DLL) that may be an individual DLL or may be one of a number of series-coupled DLLs. The DLL or series of DLLs may provide the desired delay in terms of the fraction of a cycle for the respectively received clock signal. In one embodiment, at least one of the DLLs may be designated as a master DLL, while at least one of the DLLs may be designated as a slave DLL. The master DLL may provide the desired fractional amount of delay and may generate a corresponding delay code. Based on the delay code, the slave DLLs may also generate the desired fractional amount of delay.

In the embodiment shown, the frequency of the DDR clock is greater than the flash clock. The DDR clock may be received by a DLL designated as the master, while the flash clock may be received by a number of series coupled DLLs which are designated as slave DLLs. Since the frequency of the DDR clock is greater than that of the flash clock, the delay code generated by the master DLL cannot be used directly to set the delay for the slave DLLs such that they both provide the same fractional amount of delay (e.g., ¼ cycle for each of their respectively received clock signals). Accordingly, clocking circuit 21 includes scaling circuitry configured to generate an adjusted delay code based on a ratio of the frequencies of the clock signals and on the delay code provided by the master DLL. The adjusted delay code may be provided to the slave DLLs to set the desired fractional amount of delay.

Figure 2:
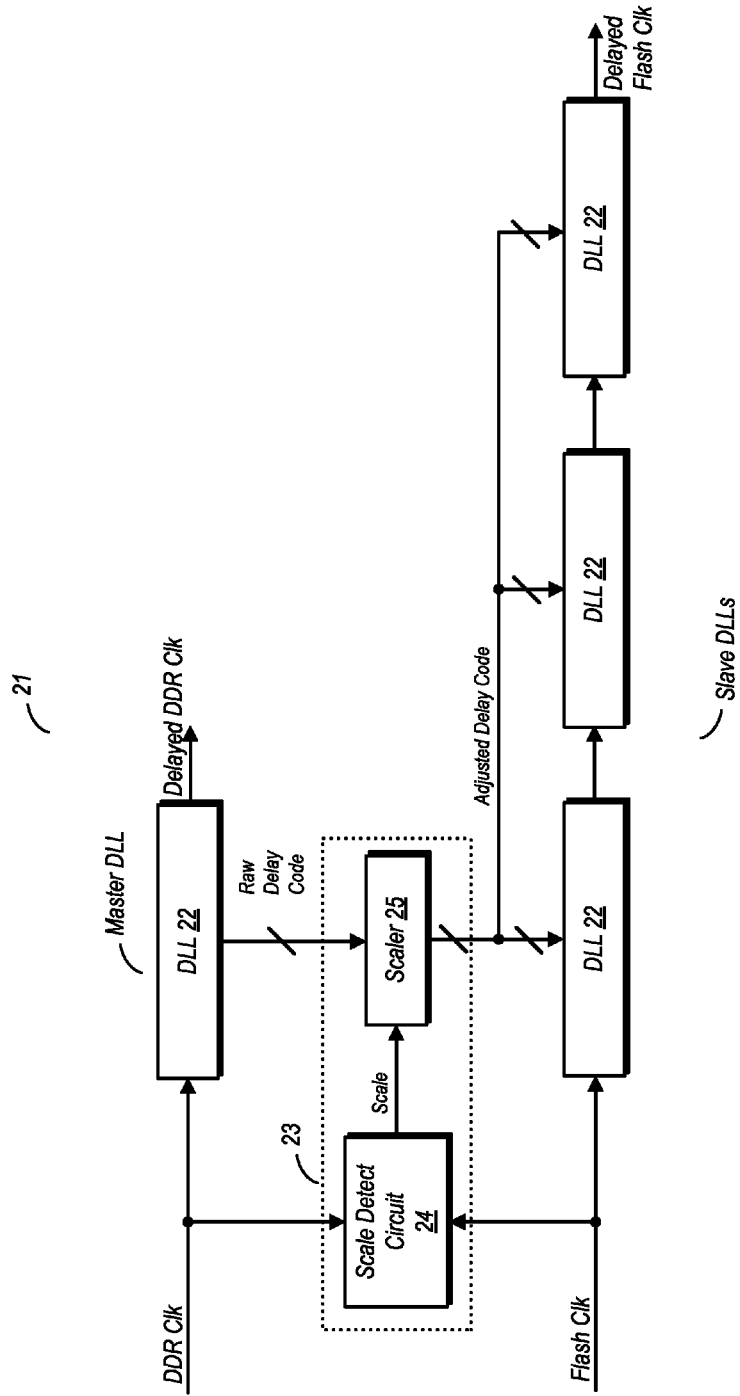
FIG. 2 is a block diagram of one embodiment of clocking circuitry within a memory interface.

Turning now to FIG. 2, a block diagram of one embodiment of clocking circuit 21 is shown. In the embodiment shown, clocking circuit includes a first DLL 22 coupled to receive the DDR clock signal, and a series-coupled chain of DLLs 22 coupled to receive the flash clock signal. The DLL 22 coupled to receive the DDR clock in the embodiment shown is designated as the master DLL, while the DLLs of the series-coupled chain are designated as slave DLLs. Each of the DLLs 22 is substantially identical to the others. Although not shown here, each of DLLs 22 may include a phase detector, a loop filter, and a number of delay elements. Various ones of the delay elements may be activated to set the desired delay, while other delay elements may remain inactive during operation.

As noted above, it may be desired to delay both the DDR clock signal and the flash clock signal by a specified amount of fractional delay, e.g., by ¼ of a cycle. The master DLL 22 may receive a signal from another source (not shown) indicating the amount of fractional delay desired. Responsive thereto, the master DLL may configure itself by enabling particular ones of its respective delay elements until the Delayed DDR clock signal lags the input DDR clock signal by the desired amount of fractional delay. A raw delay code may be provided by the master DLL 22 indicative of the number of delay elements activated to achieve the desired fractional delay.

Since the flash clock signal has a lower frequency than the DDR clock signal in the embodiment shown, additional delay elements are utilized to achieve the same amount of fractional delay as provided by the singular master DLL 22. Furthermore, since multiple slave DLLs 22 are used to achieve the desired fractional delay, the raw delay code generated by the master DLL 22 is not directly applied to the slave DLLs.

To obtain the desired fractional delay in slave DLLs 22, scaling circuit 23 is implemented. In the embodiment shown, scaling circuit 22 is configured to generate an adjusted delay code based on the raw delay code and a ratio of the DDR clock frequency to the flash clock frequency. The scaling circuit 23 is coupled to receive both the DDR clock signal, the flash clock signal, and the raw delay code as inputs. A scale detect circuit 24 in the embodiment shown is configured to determine the ratio, or scale, of the DDR clock frequency to the flash clock frequency. The scale value is provided to scaler 25, which is configured to adjust the raw delay code by a scaling factor in order to generate the adjusted delay code. The adjusted delay code is then provided to the slave DLLs 22. Responsive to the adjusted delay code, the slave DLLs 22 activate selected ones of their respective delay elements to provide the desired fractional delay to the Flash clock signal, thereby producing the delayed flash clock signal.

Figure 3:
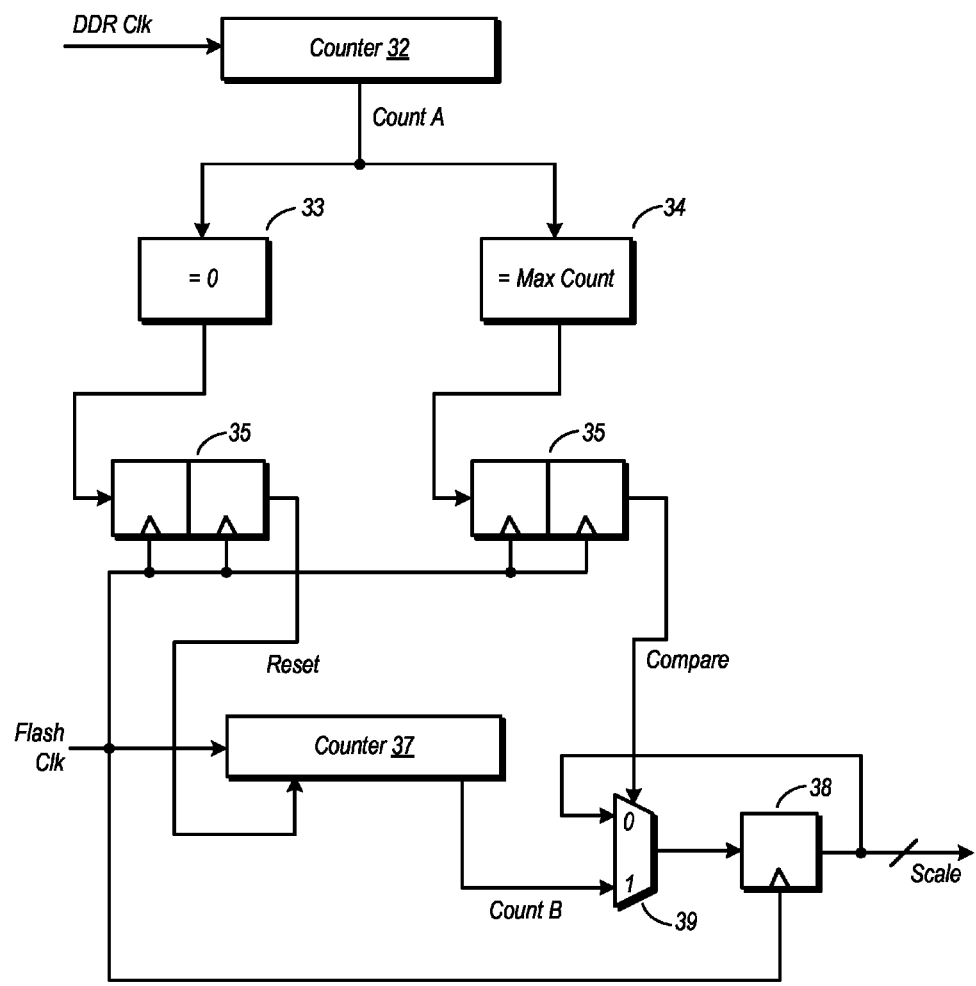
FIG. 3 is a block diagram of one embodiment of a scale detection circuit.

FIG. 3 is a block diagram of one embodiment of scale detect circuit 24. In the embodiment shown, scale detect circuit 24 includes a first counter 32 that increments based on receiving the DDR clock signal, and a second counter 37 that increments based on receiving the flash clock signal. Thus, since the DDR clock has a higher frequency than the flash clock signal, counter 32 increments faster than counter 37 in this particular embodiment.

Scale detect circuit 24 in the embodiment shown includes a reset circuit comprising reset detection circuit 33 and a first synchronizer 35. Reset detection circuit 33 is coupled to receive Count A, i.e. the count value output from counter 32. When the count of counter 32 is at zero, reset detection 33 asserts a reset signal that is passed to the correspondingly coupled synchronizer 35. Synchronizer 35 in the embodiment shown is coupled is a double flop circuit coupled to receive the flash clock circuit. Accordingly, the reset signal output by reset detection circuit 33 is synchronized to the flash clock signal and provided to counter 37. Responsive to receiving the reset signal, the output of counter 37, Count B, is reset to zero. Generation of the reset signal when Count A is at zero may ensure that both counter 32 and counter 37 begin incrementing from zero during the process of determining the ratio of the DDR clock frequency to the flash clock frequency.

After both counters 32 and 37 have been reset, they may begin incrementing in accordance with their respectively received clock signals. In one embodiment, counter 32 is substantially identical to counter 37. Accordingly, since counter 32 increments faster (since the DDR clock frequency is greater than the flash clock frequency), it will reach its maximum count value while counter 37 is still incrementing.

Maximum count circuit 34 in the embodiment shown is coupled to receive Count A, and is configured to determine when counter 32 has reached its maximum count. When counter 32 has reached its maximum count, maximum count circuit 34 may assert a compare signal. The compare signal may be passed through another synchronizer 35 in order to synchronize it to the flash clock. The compare signal may then be received as in input to multiplexer 39. When the compare signal is asserted on the select input of multiplexer 39, Count B (the output of counter 39) is passed to synchronizer 38. Since the maximum count value of counter 32 is a prior known value, the ratio of the two frequencies may be extrapolated from Count B alone when it is passed through multiplexer 39. For example, if the maximum count of counter 32 is 1024, and the Count B is passed through multiplexer as a value of 256, a frequency ratio of the DDR clock signal to the flash clock signal of 4:1 may be extrapolated, since 1024 is four times 256. Thus, Count B may be passed as is to scaler 25. Based on the value of Count B and the raw delay code, scaler 25 may generate the adjusted delay code.

Figure 4:
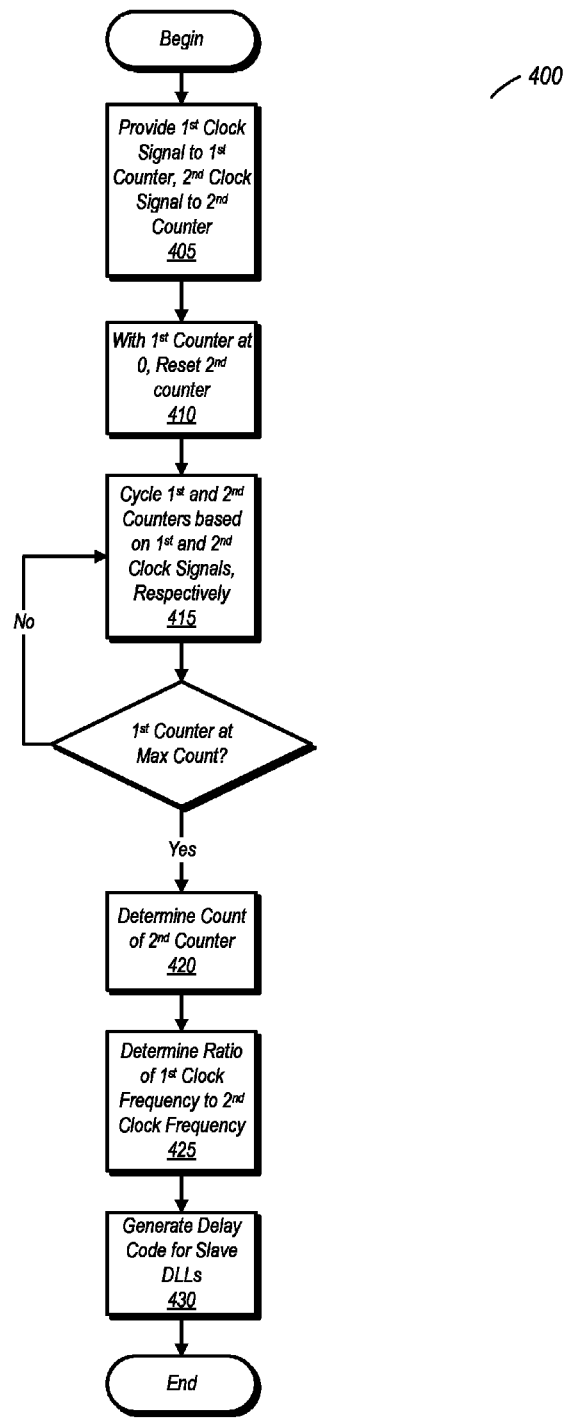
FIG. 4 is a flow diagram illustrating one embodiment of a method for scaling a DLL code when master and slave DLLs operate at different frequencies.

FIG. 4 is a flow diagram illustrating one embodiment of a method for scaling a DLL code when master and slave DLLs operate at different frequencies. Method 400 in the embodiment shown may be performed using various embodiments of the hardware/circuitry discussed above. It is further possible and contemplated that method 400 may be carried out using other embodiments of hardware/circuitry not explicitly discussed herein.

Method 400 begins with providing a first clock signal to a first counter and a second clock signal to a second counter (block 405). The first clock signal may have a higher frequency than the second clock signal. Furthermore, the first clock signal may be that which is received by a master DLL, while the second clock signal is received by a slave DLL or a number of slave DLLs.

The process of determining a ratio between the first and second clock frequencies may be initiated by resetting the first counter, and responsive thereto, resetting the second counter (block 410). The counters may then begin incrementing in synchronization with their respectively received clock signals (block 415). If the first counter has not yet reached its maximum count value (block 415, no), counting may continue. When the first counter does finally reach its maximum count value (block 415, yes), the count value of the second counter at that time may be determined (block 420). Based on the count value of the second counter at the time the first counter reaches its maximum count value, a ratio between the frequencies of the first and second clock signals may be determined (block 425). The ratio may be expressed in various ways, although in general, the generated value may be one from which the ratio of the frequencies may be derived. Based on the ratio, and a raw delay code provided by the master DLL, an adjusted delay code for the slave DLLs is generated (block 430).

Figure 5:
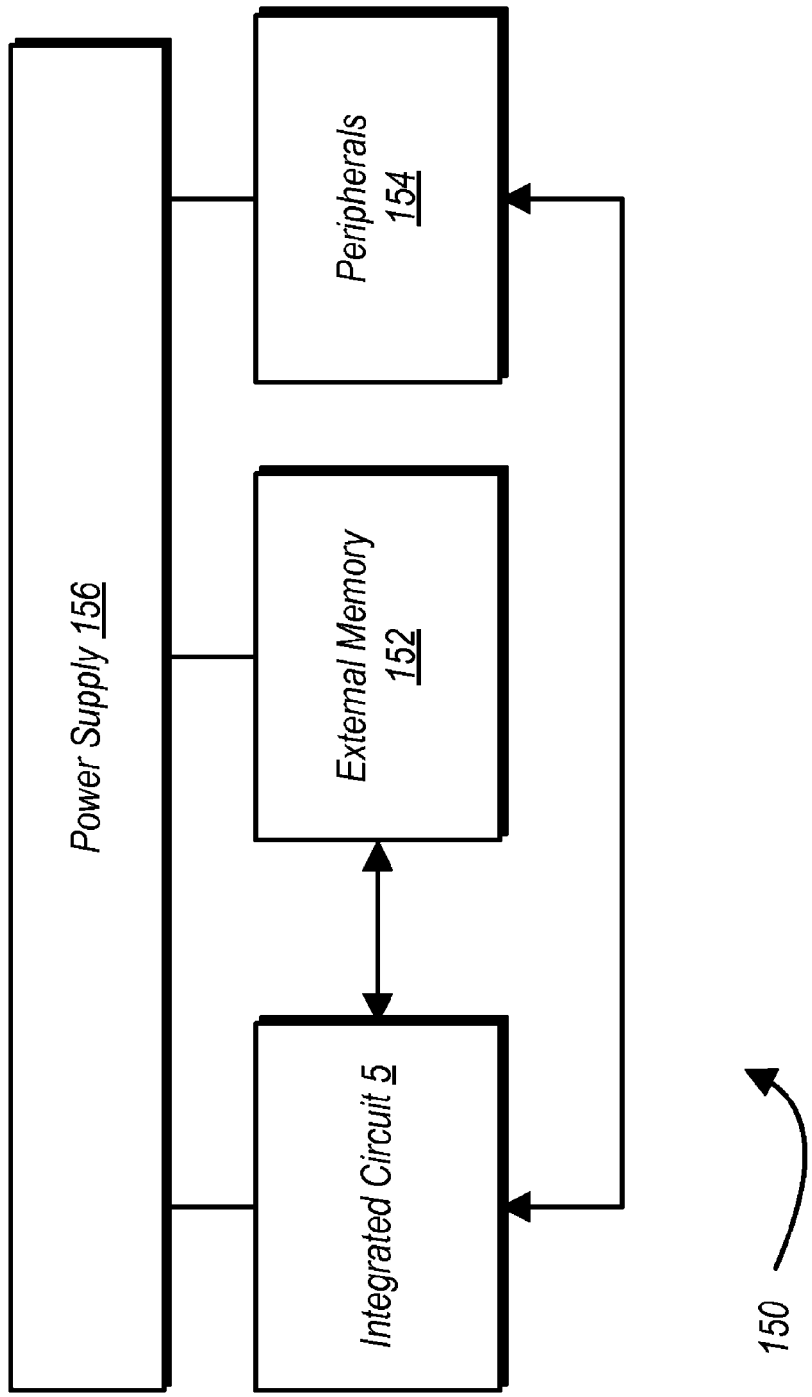
FIG. 5 is a block diagram of one embodiment of a system.

Turning next to FIG. 5, a block diagram of one embodiment of a system 150 is shown. In the illustrated embodiment, the system 150 includes at least one instance of an IC 5 (e.g., that implements SoC 10 of FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a master delay locked loop (DLL) coupled to receive a first clock signal having a first frequency;
   a plurality slave DLLs coupled in series, wherein a first slave DLL is coupled to receive a second clock signal having a second frequency; and
   a scaling unit configured to determine a number of delay stages to be activated in the plurality of slave DLLs based on a number of delay stages active in the master DLL and a ratio of the first frequency and the second frequency.

2. The apparatus as recited in claim 1, wherein the first frequency is greater than the second frequency.

3. The apparatus as recited in claim 1, wherein the scaling unit includes:
   a first counter coupled to receive the first clock signal;
   a second counter coupled to receive the second clock signal; and
   a comparator.

4. The apparatus as recited in claim 3, wherein the first counter is configured to, responsive to reaching a maximum count value, cause a reset of the second counter; and
   wherein the comparator is configured to determine the value of a count of the second counter at a point in time when the first counter reaches its maximum value and further configured to generate a scaling value based on the count of the second counter and a maximum count of the first count.

5. The apparatus as recited in claim 4, wherein the scaling unit is further configured to generate an adjusted delay code to be provided to the plurality of slave DLLs based on a raw delay code received from the master DLL and the scaling value.

6. A method comprising:
   receiving, at an input of a master delay locked loop (DLL), a first clock signal having a first frequency;
   receiving, at an input of a series-coupled plurality of slave DLLs, a second clock signal having a second frequency;

determining a total number of delay stages to be activated in the series-coupled plurality of slave DLLs to be activated based on a number of active stages in the master DLL and a ratio of the first and second frequencies.

7. The method as recited in claim 6, further comprising:
configuring the first DLL to delay the first clock signal by a predetermined portion of a cycle of the first clock signal; and
configuring the second DLL to delay the clock signal by a predetermined portion of a cycle of the second clock signal;
wherein the first frequency is greater than the second frequency, and wherein the predetermined portion of the cycle of the first clock signal is equal to the predetermined portion of the second clock signal.

8. The method as recited in claim 6, further comprising:
operating a first counter based on the first clock signal;
operating a second counter based on the second clock signal;
generating a signal responsive to the first counter reaching a maximum count value; and
determining a count value of the second counter responsive to the signal.

9. The method as recited in claim 8, further comprising determining a ratio of the first frequency to the second frequency based on the maximum count value of the first counter and the count value of the second counter at a point in time when the signal was generated.

10. The method as recited in claim 9, further comprising determining the total number of delay stages to be activated in the series-coupled plurality of slave DLLs to be activated based on the number of active stages in the master DLL and the ratio of the first frequency to the second frequency.

11. An integrated circuit comprising:
a first memory configured to, during a read cycle thereof, provide a first clock signal;
a second memory configured to, during a read cycle thereof, provide a second clock signal;
a memory controller coupled to the first and second memories, wherein the memory controller includes:
a master delay locked loop (DLL) coupled to receive the first clock signal;
a plurality of slaved DLLs coupled together in series and coupled to receive the second clock signal; and
scaling circuitry configured to determine a number of delay stages to be activated in the plurality of slave DLLs based on a number of delay stages active in the master DLL and a ratio of a frequency of the first clock signal to a frequency of the second clock signal, wherein the frequency of the first clock signal is greater than the frequency of the second clock signal.

12. The integrated circuit as recited in claim 11, wherein the scaling circuitry includes:
a first counter coupled to receive the first clock signal;
a second counter coupled to receive the second clock signal; and
a comparator configured to determine the value of a count of the second counter at a point in time when the first counter reaches its maximum value and further configured to generate a scaling value based on the count of the second counter and a maximum count of the first count.

13. The integrated circuit as recited in claim 12, wherein the scaling circuit is further configured to generate an adjusted delay code to be provided to the plurality of slave DLLs based on a raw delay code received from the master DLL and the scaling value, wherein the raw delay code is indicative of an amount of delay provided by the master DLL, and wherein the adjusted delay code is indicative of an amount of delay to be provided by the plurality of slave DLLs.

14. The integrated circuit as recited in claim 13, wherein the first DLL is configured to delay a cycle of the first clock signal by a fixed percentage, and wherein the second DLL is configured to, based on the adjusted delay code, delay a cycle of the second clock signal by the fixed percentage.

15. The integrated circuit as recited in claim 12, wherein the scaling circuitry includes a reset circuit configured to reset the second counter responsive to the first counter having a count value of zero.

* * * * *